(12) United States Patent
Saito et al.

(10) Patent No.: US 7,953,229 B2
(45) Date of Patent: May 31, 2011

(54) SOUND PROCESSOR, SOUND REPRODUCER, AND SOUND PROCESSING METHOD

(75) Inventors: Kazuyuki Saito, Tokyo (JP); Toshifumi Yamamoto, Kanagawa (JP); Norikatsu Chiba, Kanagawa (JP); Shigeyasu Iwata, Tokyo (JP); Yasuhiro Kanishima, Tokyo (JP); Takashi Fukuda, Tokyo (JP); Yutaka Oki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 12/543,265

(22) Filed: Aug. 18, 2009

(65) Prior Publication Data

US 2010/0166218 A1    Jul. 1, 2010

(30) Foreign Application Priority Data

Dec. 25, 2008    (JP) ................. 2008-331060

(51) Int. Cl.
*H04R 29/00*     (2006.01)
*H03G 5/00*      (2006.01)
*H04R 1/10*      (2006.01)

(52) U.S. Cl. ............... 381/58; 381/59; 381/74; 381/103

(58) Field of Classification Search .............. 381/56, 381/58, 59, 60, 74, 309, 98, 101, 102, 103
See application file for complete search history.

(56) References Cited

U.S. PATENT DOCUMENTS

| | | | |
|---|---|---|---|
| 5,418,859 A | 5/1995 | Cho | |
| 5,761,314 A | 6/1998 | Inanaga et al. | |
| 6,167,138 A * | 12/2000 | Shennib | 381/60 |
| 6,402,782 B1 | 6/2002 | Sibbald et al. | |
| 7,177,433 B2 * | 2/2007 | Sibbald | 381/74 |
| 2006/0060070 A1 | 3/2006 | Terauchi et al. | |

FOREIGN PATENT DOCUMENTS

| | | |
|---|---|---|
| JP | H03-074437 | 7/1991 |
| JP | 04-357800 | 12/1992 |
| JP | 05-027800 | 4/1993 |
| JP | 06-112743 A | 4/1994 |
| JP | 07-042300 | 7/1995 |
| JP | 09-187093 | 7/1997 |
| JP | 2000-091865 A | 3/2000 |
| JP | 2001-525141 | 12/2001 |
| JP | 2004-320098 | 11/2004 |
| JP | 2004-364125 A | 12/2004 |
| JP | 3637596 B2 | 1/2005 |
| JP | 2006-065100 A | 3/2006 |
| JP | 2006-121188 | 5/2006 |
| JP | 2008-177798 | 7/2008 |
| WO | 95/20866 A1 | 8/1995 |

* cited by examiner

*Primary Examiner* — Ping Lee
(74) *Attorney, Agent, or Firm* — Blakely, Sokoloff, Taylor & Zafman LLP

(57) ABSTRACT

According to one embodiment, a sound processor includes a creating module, a filter, and a combining module. The creating module creates a plurality of first acoustic models based on a frequency characteristic that represents an acoustic property of an object to be measured. The first acoustic models are modeled with respect to resonance properties that vary depending on frequency bands. The filter extracts frequency components in the frequency bands from the respective first acoustic models. The combining module combines the frequency components extracted from the first acoustic models to create a second acoustic model.

9 Claims, 14 Drawing Sheets

EAR CANAL

TRIPLE OSCILLATION
FUNDAMENTAL OSCILLATION $H_{ear}(\omega)$

FREQUENCY $\omega$

FUNDAMENTAL OSCILLATION

DOUBLE OSCILLATION

FREQUENCY [Hz]

SOUND PROCESSOR, SOUND REPRODUCER, AND SOUND PROCESSING METHOD

CROSS-REFERENCE TO RELATED APPLICATIONS

This application is based upon and claims the benefit of priority from Japanese Patent Application No. 2008-331060, filed on Dec. 25, 2008, the entire contents of which are incorporated herein by reference.

BACKGROUND

1. Field

One embodiment of the invention relates to a sound processor that creates an acoustic model based on resonance properties, a sound reproducer, and a sound processing method.

2. Description of the Related Art

Portable sound reproducers have been commonly used to listen to music playback or the like through a headphone. With such a sound reproducer, the user is likely to listen to music at his/her desired volume. Accordingly, it is often the case that users listen to music for quite a long time at a relatively high volume. This may damage the hearing of the users. To prevent this situation, there have been proposed various technologies.

For example, International Publication No. WO1995/020866 discloses a conventional technology in which an acoustic signal is divided with respect to frequency bands to facilitate correction.

The conventional technology is aimed at simply correcting reflected noise, and does not take into account resonance properties.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
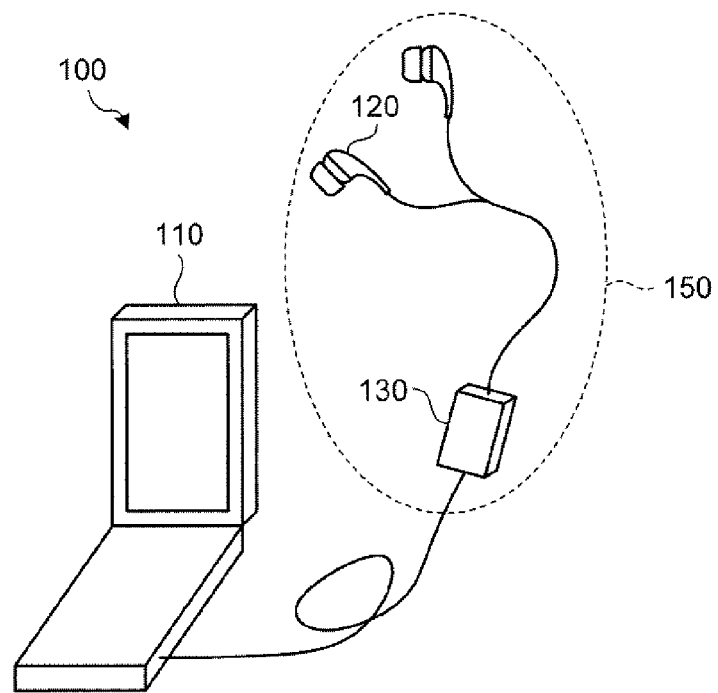
FIG. 1 is an exemplary schematic diagram of a sound reproducer according to an embodiment of the invention.

Various embodiments according to the invention will be described hereinafter with reference to the accompanying drawings. In general, according to one embodiment of the invention, a sound processor comprises a creating module, a filter, and a combining module. The creating module is configured to create first and second resonance tube models based on a frequency characteristic that represents an acoustic property of an object to be measured, the first resonance tube model being modeled based on resonance properties of a first resonance peak with respect to a frequency band enclosing a first resonance frequency at the first resonance peak represented as the frequency characteristic, the second resonance tube model being modeled based on resonance properties of a second resonance peak with respect to a frequency band enclosing a high order resonance frequency which is not an integer multiple of the first resonance frequency at the second resonance peak represented as the frequency characteristic. The filter is configured to extract frequency component in the frequency band enclosing the first resonance frequency from the first resonance tube model to create a first partial acoustic model, and extract frequency component in the frequency band enclosing the second resonance frequency from the second resonance tube model to create a second partial acoustic model. The combining module is configured to combine the first partial acoustic model and the second partial acoustic model to create an entire acoustic model.

According to another embodiment of the invention, a sound reproducer comprises a creating module, a filter, a combining module, signal generator, and a corrector. The creating module is configured to create first and second resonance tube models based on a frequency characteristic that represents an acoustic property of an object to be measured, the first resonance tube model being modeled based on resonance properties of a first resonance peak with respect to a frequency band enclosing a first resonance frequency at the first resonance peak represented as the frequency characteristic, the second resonance tube model being modeled based on resonance properties of a second resonance peak with respect to a frequency band enclosing a high order resonance frequency which is not an integer multiple of the first resonance frequency at the second resonance peak represented as the frequency characteristic. The filter is configured to extract frequency component in the frequency band enclosing the first resonance frequency from the first resonance tube model to create a first partial acoustic model, and extract frequency component in the frequency band enclosing the second resonance frequency from the second resonance tube model to create a second partial acoustic model. The combining module is configured to combine the first partial acoustic model and the second partial acoustic model to create an entire acoustic model. The signal generator is configured to generate an acoustic signal to be output to the object to be measured. The corrector is configured to correct an acoustic property of the acoustic signal generated by the signal generator using the second acoustic model.

According to still another embodiment of the invention, there is provided a sound processing method applied to a sound processor. The sound processing method comprises: creating first and second resonance tube models based on a frequency characteristic that represents an acoustic property of an object to be measured, the first resonance tube model being modeled based on resonance properties of a first resonance peak with respect to a frequency band enclosing a first resonance frequency at the first resonance peak represented as the frequency characteristic, the second resonance tube model being modeled based on resonance properties of a second resonance peak with respect to a frequency band enclosing a high order resonance frequency which is not an integer multiple of the first resonance frequency at the second resonance peak represented as the frequency characteristic; extracting frequency component in the frequency band enclosing the first resonance frequency from the first resonance tube model to create a first partial acoustic model, and extract frequency component in the frequency band enclosing the second resonance frequency from the second resonance tube model to create a second partial acoustic model; and combining the first partial acoustic model and the second partial acoustic model to create an entire acoustic model.

FIG. 1 is a schematic diagram of a sound reproducer 100 to which applied an acoustic characteristic correction device according to an embodiment of the invention. As illustrated in FIG. 1, the sound reproducer 100 comprises an acoustic characteristic correction device 150 and a mobile telephone 110. The acoustic characteristic correction device 150 comprises an earphone 120 and a main body 130.

Inside the mobile telephone 110, an audio data generator (not illustrated) generates (reproduces) audio data and outputs the audio data to the acoustic characteristic correction device 150. Upon receipt of the audio data, the acoustic characteristic correction device 150 corrects the resonance properties of the audio data (sound source signal) and then outputs an acoustic signal obtained by the correction to an object to be measured through the earphone 120. In the embodiment, it is assumed, for example, that the ear canal of the user is the object to be measured. The earphone 120 is provided with a built-in microphone 330, which will be described later. Described below is the earphone 120.

Figure 2:
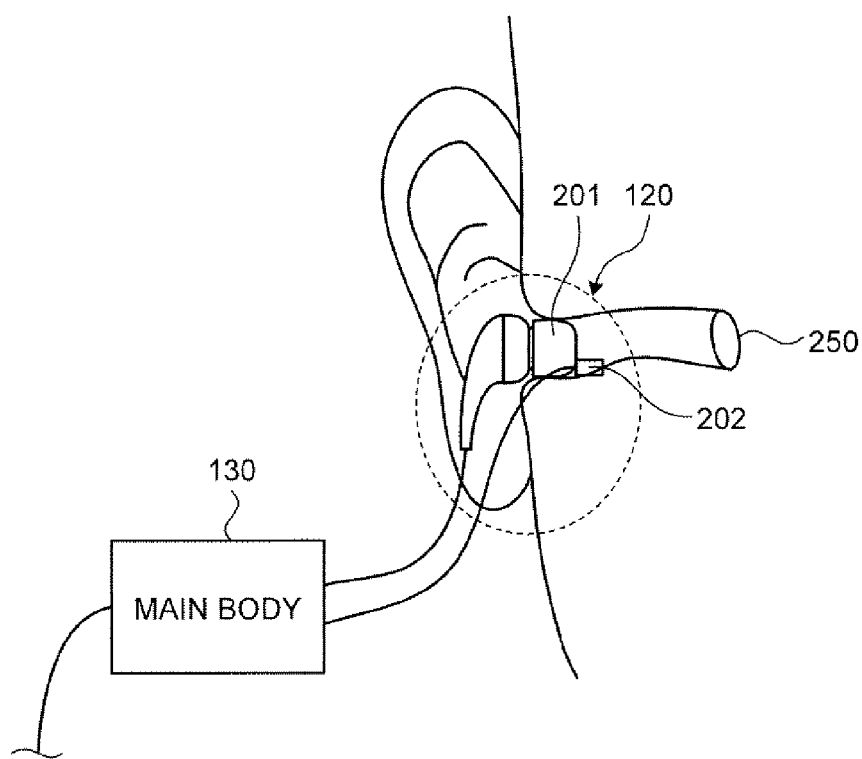
FIG. 2 is an exemplary conceptual diagram of an earphone used to correct resonance properties and the surrounding environment in the embodiment.

FIG. 2 is a conceptual diagram of the earphone 120 used to correct resonance properties and the surrounding environment. As illustrated in FIG. 2, the earphone 120 is placed in the entrance of the ear canal. The earphone 120 comprises a sound output module 201 (sound tube). Near the sound output module 201 is located a sound input module 202 of the microphone 330. The sound output module 201 and the sound input module 202 are each electrically connected to the main body 130 of the acoustic characteristic correction device 150. An acoustic signal output from the sound output module 201 reaches the position of an eardrum through the ear canal, i.e., an object to be measured, 250.

in the example of FIG. 2, the sound input module 202 of the microphone 330 is illustrated as being separate from the earphone 120 so that it is clearly visible. However, the sound input module 202 is in practice located inside the earphone 120 near the sound output module 201.

Figure 3:
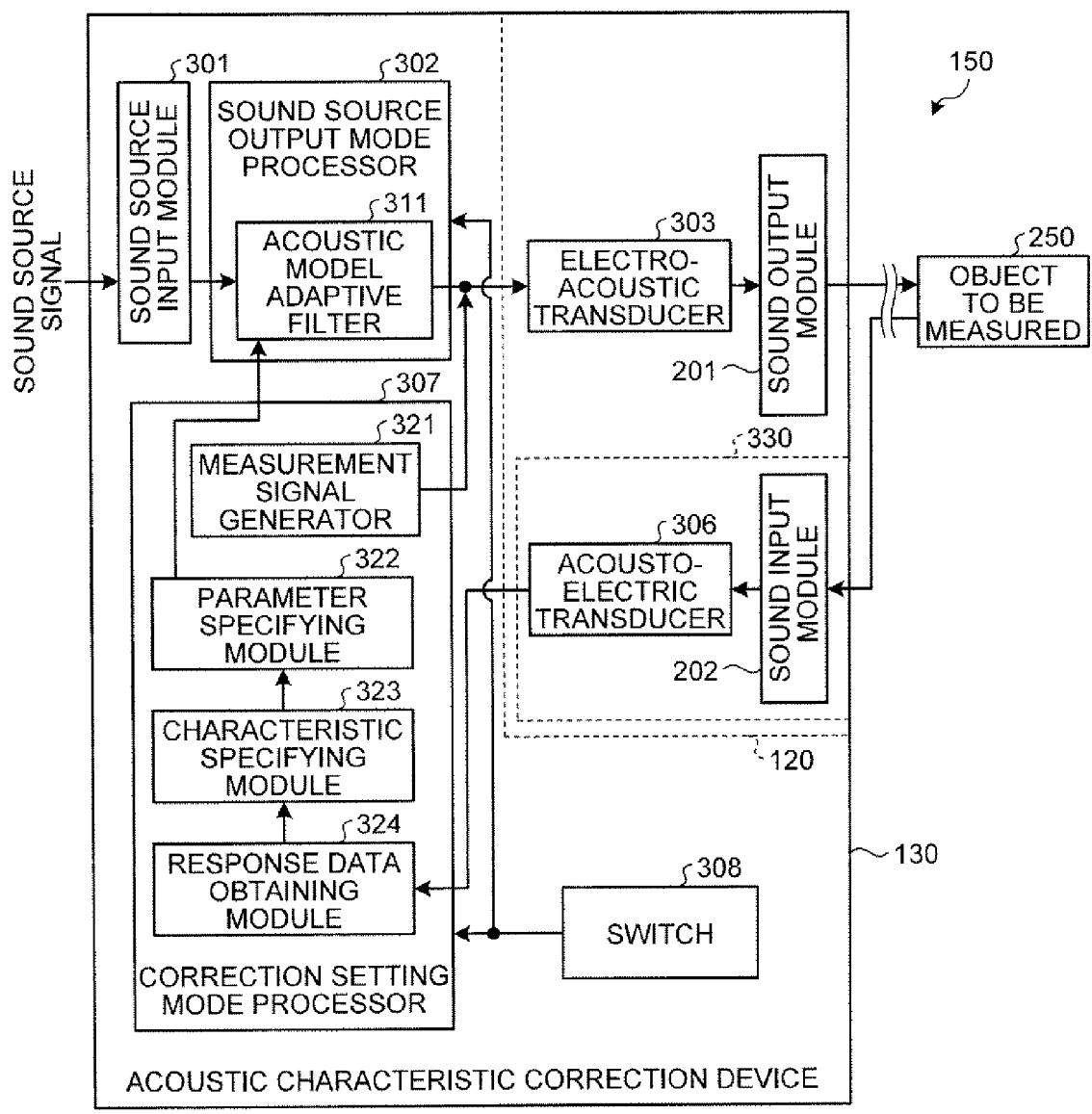
FIG. 3 is an exemplary block diagram of an acoustic characteristic correction device in the embodiment.

FIG. 3 is a block diagram of the acoustic characteristic correction device 150 of the embodiment. As illustrated in FIG. 3, the acoustic characteristic correction device 150 comprises the earphone 120 and the main body 130.

The earphone 120 comprises an electroacoustic transducer 303, the sound output module 201, and the microphone 330. The microphone 330 comprises the sound input module 202 and an acoustoelectric transducer 306.

Upon receipt of an electrical signal as a sound source signal from the main body 130, the electroacoustic transducer 303 converts the sound source signal to an acoustic signal. The sound output module 201 outputs the acoustic signal.

The sound input module 202 of the microphone 330 receives an acoustic signal from the ear canal of the user. In the embodiment, when the sound output module 201 outputs an acoustic signal for measurement (hereinafter, "measurement acoustic signal"), the sound input module 202 receives a signal (hereinafter, "response acoustic signal") in response to the measurement acoustic signal. As has been described above, the sound input module 202 is located near the sound output module 201.

Upon receipt of an acoustic signal (a response acoustic signal), the acoustoelectric transducer 306 converts the response acoustic signal to an electrical signal. The electrical signal converted from the response acoustic signal will be hereinafter referred to as "response signal".

If the resonant frequency can be eliminated at the position of the eardrum, it means that an appropriate correction is performed for the user. However, it is difficult to place the microphone at the position of the eardrum of the user each time the user uses the microphone. Therefore, according to the embodiment, the microphone 330 is built in the earphone 120.

Figure 4:
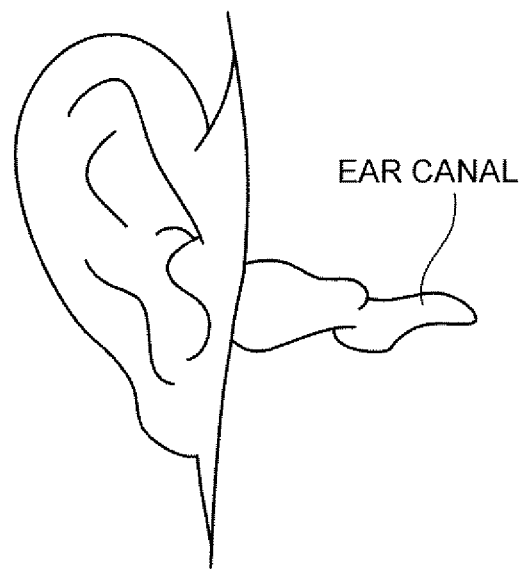
FIG. 4 is an exemplary conceptual diagram of the ear canal in which the earphone is not placed in the embodiment.
Figure 5:
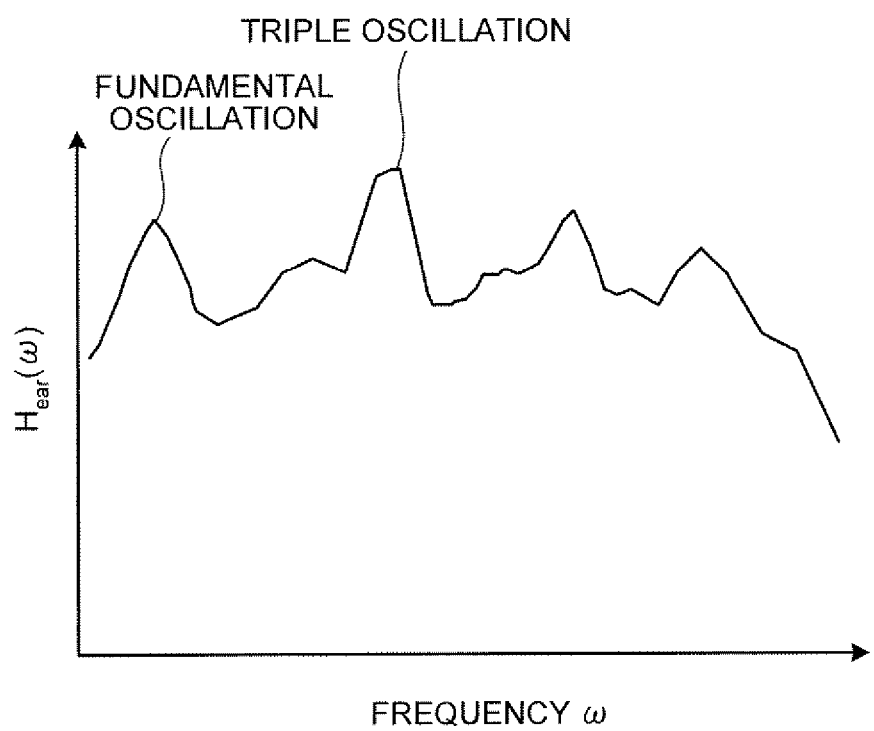
FIG. 5 is an exemplary chart of the frequency characteristics of the ear canal in which the earphone is not placed in the embodiment.

In the embodiment, the resonance properties of the ear canal are measured while the user wears the earphone 120. FIG. 4 is a conceptual diagram of the ear canal in which the earphone 120 is not placed. As illustrated in FIG. 4, when the earphone 120 is not placed in the ear canal, the ear canal can be modeled as a one-side closed tube. FIG. 5 is a chart of the frequency characteristics of the ear canal in which the earphone 120 is not placed. As illustrated in FIG. 5, a plurality of resonance peaks are represented as the frequency characteristics of the ear canal.

Figure 6:
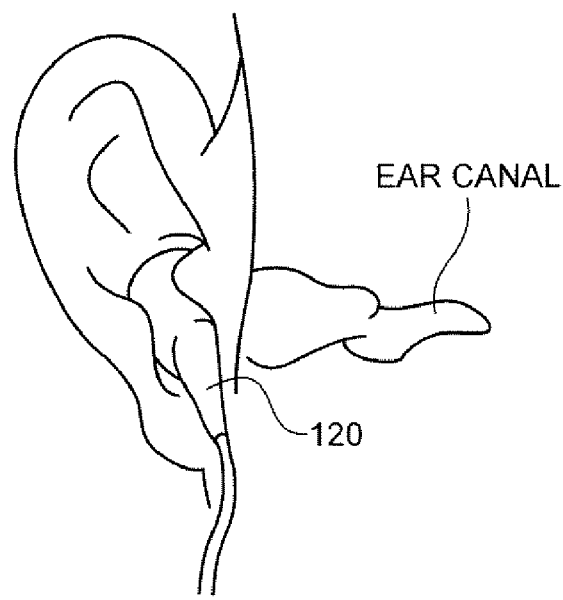
FIG. 6 is an exemplary conceptual diagram of the ear canal in which the earphone is placed in the embodiment.
Figure 7:
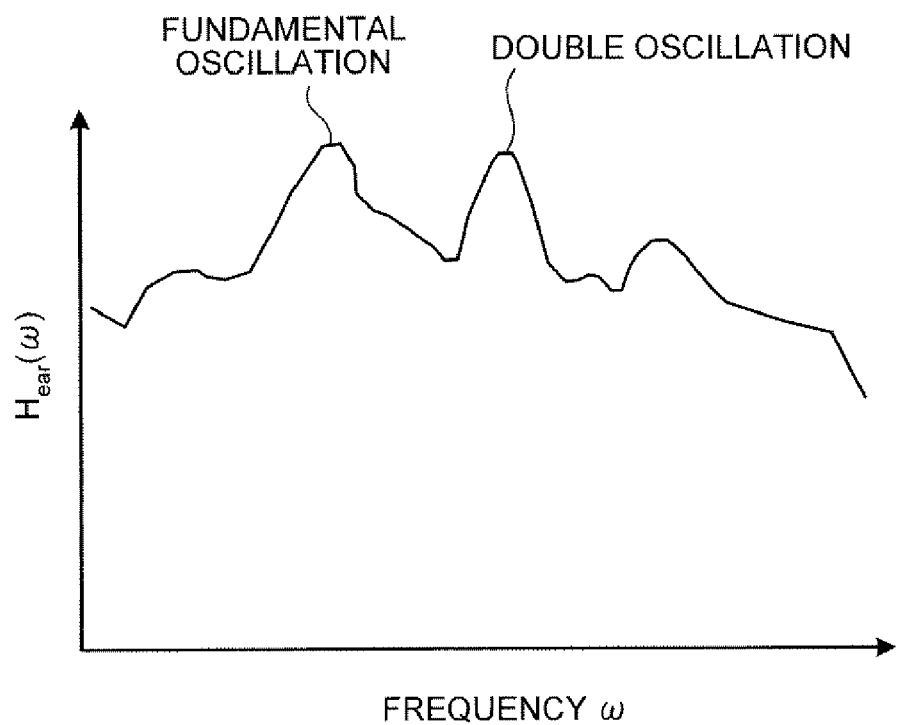
FIG. 7 is an exemplary chart of the frequency characteristics of the ear canal in which the earphone is placed in the embodiment.

FIG. 6 is a conceptual diagram of the ear canal in which the earphone 120 is placed. As illustrated in FIG. 6, when the earphone 120 is placed in the ear canal, the ear canal can be modeled as a both-side closed tube. FIG. 7 is a chart of the frequency characteristics of the ear canal in which the earphone 120 is placed. As illustrated in FIG. 7, a plurality of resonance peaks are represented as the frequency characteristics of the ear canal.

Comparing the frequency characteristics of the ear canal illustrated in FIG. 5 with those illustrated in FIG. 7, it can be understood that there is a difference in resonant frequency at a resonance peak and gain of the resonant frequency between when the earphone 120 is placed in the ear canal and when the earphone 120 is not placed therein. In this manner, the ear canal becomes from a one-side closed tube to a both-side closed tube when the user wears the earphone 120, which causes a change in the spectrum structure.

When such a change occurs in the spectrum structure, there may be a case that a change especially in resonant frequency adversely affects the sense of hearing. Therefore, according to the embodiment, the resonant frequency is corrected when changed due to the placement of the earphone 120 in the ear canal as the object to be measured.

Figure 8:
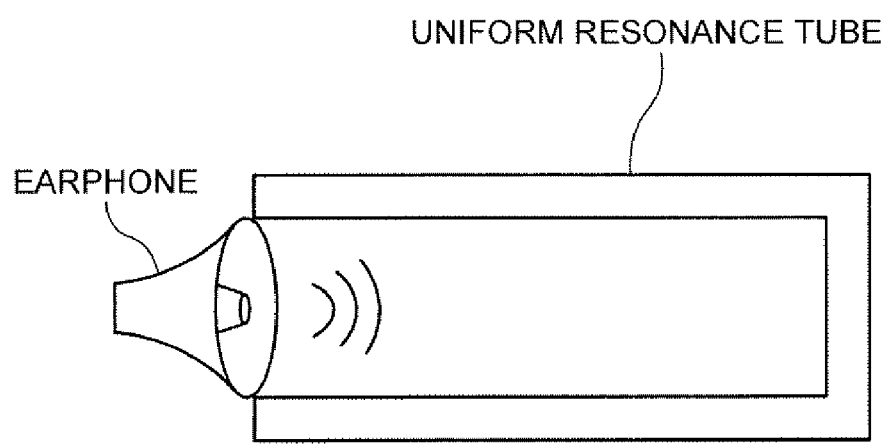
FIG. 8 is an exemplary conceptual diagram of the ear canal, in which the earphone is placed, assumed to be a uniform resonance tube blocked by a wall (eardrum) and the earphone in the embodiment.
Figure 9:
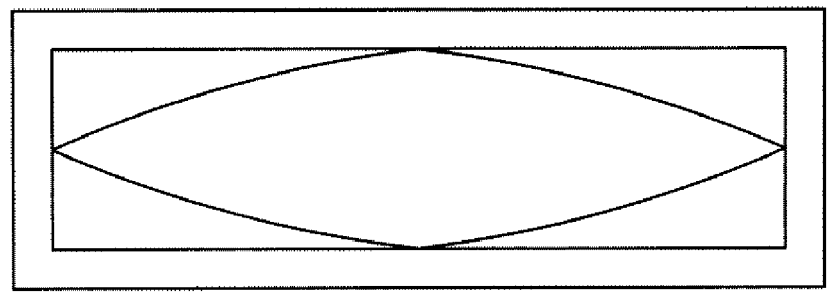
FIG. 9 is an exemplary conceptual diagram of fundamental oscillation in the uniform resonance tube in the embodiment.
Figure 10:
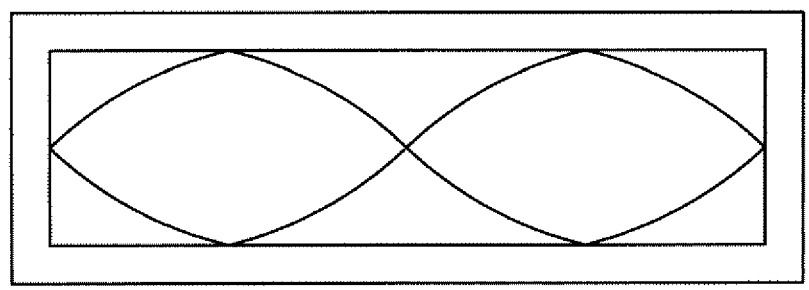
FIG. 10 is an exemplary conceptual diagram of double oscillation in the uniform resonance tube in the embodiment.

FIG. 8 is a conceptual diagram of the ear canal, in which the earphone is placed, assumed to be a uniform resonance tube blocked by a wall (eardrum) and the earphone. In this case, numerous resonant frequencies occur such as the resonant frequency of the fundamental oscillation (first resonance peak) as illustrated in FIG. 9 and the resonant frequency of the double oscillation (second resonance peak) as illustrated in FIG. 10.

Figure 11:
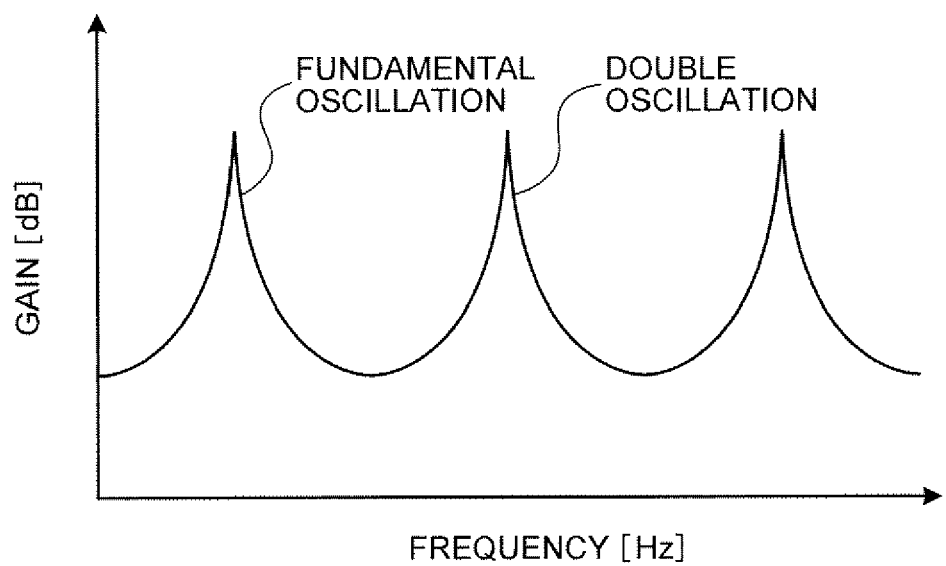
FIG. 11 is an exemplary chart of the frequency characteristics of the uniform resonance tube representing the ear canal in the embodiment.

FIG. 11 is a chart of the frequency characteristics of the uniform resonance tube representing the ear canal. As illustrated in FIG. 11, the resonant frequency adversely affects the sense of hearing at an integer multiple of the fundamental oscillation frequency, and therefore, this resonant frequency needs to be eliminated. In the case of such frequency characteristics, the resonance can be suppressed by using the reverse characteristics of the uniform resonance tube as illustrated in FIG. 12.

Figure 12:
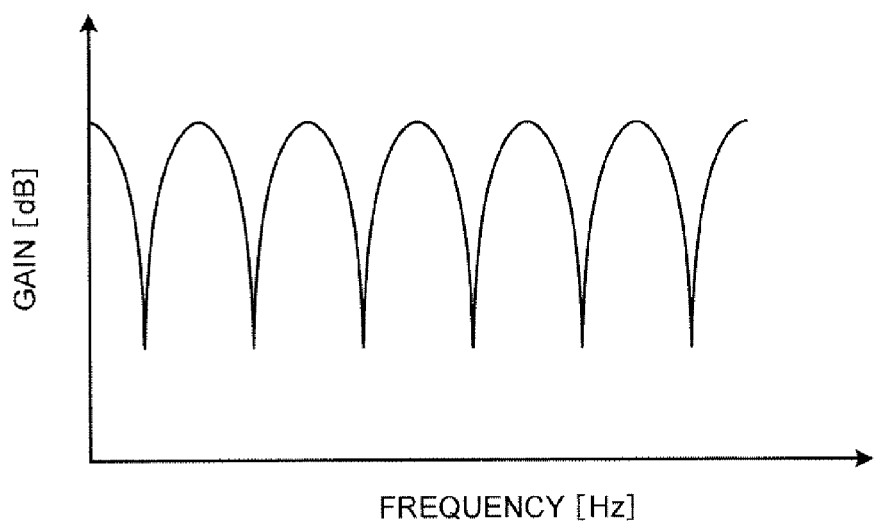
FIG. 12 is an exemplary conceptual chart of the reverse characteristics of resonance in the uniform resonance tube in the embodiment.
Figure 13:
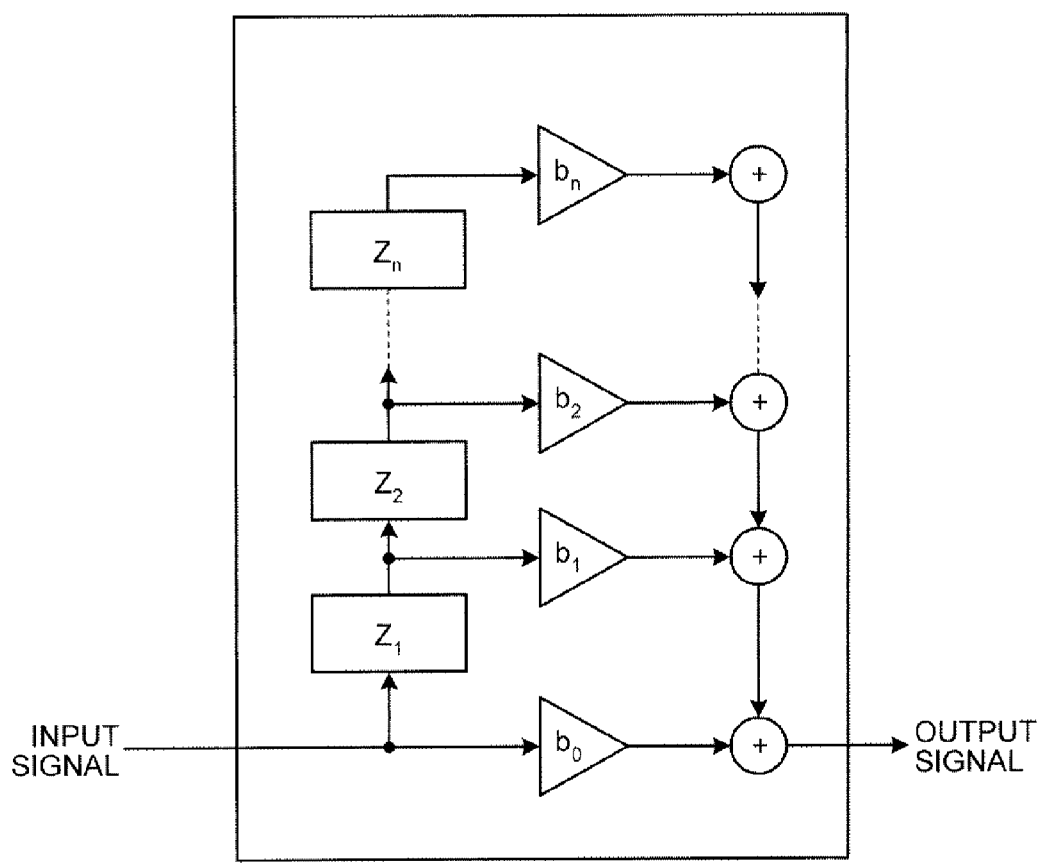
FIG. 13 is an exemplary schematic diagram of a configuration of a comb filter representing the reverse characteristics of resonance in the embodiment.

The filter having the frequency characteristics as illustrated in FIG. 12 is generally referred to as a comb filter. FIG. 13 is a schematic diagram of a configuration of the comb filter. As illustrated in FIG. 13, the comb filter can be implemented by a combination of n delay elements ($z_1$ to $z_n$) and n amplifying elements ($b_1$ to $b_n$).

However, since the ear canal is of a complicated shape including a narrow zone, the resonant frequency does not always occur as an integer multiple of the fundamental oscillation frequency differently from the case of the uniform resonance tube. As with this case, if the ear canal has acoustic properties or characteristics that are not flat on the frequency scales, this cannot be handled by a model using the uniform resonance tube. Thus, it is difficult to appropriately suppress the resonance by using the reverse characteristics of the uniform resonance tube described above.

Figure 14:
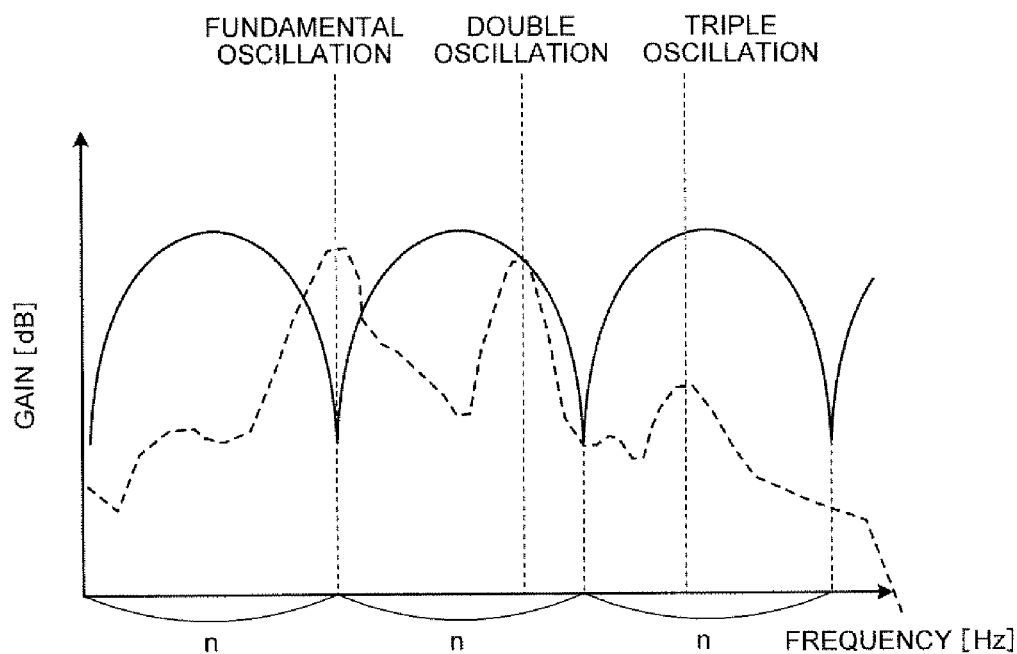
FIG. 14 is an exemplary chart of the frequency characteristics of the ear canal having acoustic properties that are not flat on the frequency scales and the reverse characteristics of the uniform resonance tube in the embodiment.

FIG. 14 is a chart of the frequency characteristics of the ear canal having acoustic properties that are not flat on the frequency scales and the reverse characteristics of the uniform resonance tube. In the example of FIG. 14, assuming that n represents the frequency of the fundamental oscillation, the frequency of the double oscillation is not represented by 2n, and also the frequency of the triple oscillation is not represented by 3n. In other words, by using the reverse characteristics of the uniform resonance tube illustrated in FIG. 14, the resonance can be suppressed with respect to the first resonance peak, while it cannot be suppressed with respect to the second resonance peak and the following resonance peaks.

That is, in the manner as described above, the resonance cannot be suppressed with respect to all resonance peaks if the ear canal has acoustic properties that are not flat on the frequency scales. The frequency may be identified that corresponds to the resonance properties of the ear canal to suppress the resonance; however, this increases the calculation load and cost. Besides, there is a possibility to pick up a factor other than the characteristics of the ear, and the accurate frequency of the ear canal may not always be identified.

To overcome the above problems, according to the embodiment, an acoustic model is created with respect to each frequency band. First, referring back to FIG. 3, the configuration of the acoustic characteristic correction device 150 will further be described.

The main body 130 comprises a sound source input module 301, a sound source output mode processor 302, a correction setting mode processor 307, and a switch 308. The sound source output mode processor 302 is provided with an acoustic model adaptive filter 311.

The acoustic characteristic correction device 150 of the embodiment is provided with two types of processing modes. One of the processing modes is correction setting mode to measure the frequency characteristics of the ear canal of the user and specify parameters of an acoustic model used in the acoustic model adaptive filter 311. The other of the processing modes is sound source output mode to output, after the correction of a sound source signal by the acoustic model adaptive filter 311 using the acoustic model to which are applied the above parameters, the sound source signal as an acoustic signal.

The term "acoustic model" as used herein refers to a model obtained by modeling the frequency characteristics of the ear canal of the user. In the embodiment, the acoustic model is created based especially on the resonance peak among the frequency characteristics of the ear canal of the user.

The switch 308 switches the processing mode between the correction setting mode and the sound source output mode. In the correction setting mode, the correction setting mode processor 307 performs processing to create an acoustic model used by a correction filter. On the other hand, in the sound source output mode, the sound source output mode processor 302 processes a sound source signal received by the sound source input module 301, and then outputs an acoustic signal to the object to be measured.

In the embodiment, the sound source signal refers to an electrical signal received from the mobile telephone 110 as audio data, while the acoustic signal refers to sound output from the sound output module 201 of the earphone 120.

The correction setting mode processor 307 comprises a measurement signal generator 321, a parameter specifying module 322, a characteristic specifying module 323, and a response data obtaining module 324. In the embodiment, when the switch 308 switches the processing mode to the correction setting mode, the respective modules perform processing triggered by the generation of a measurement reference signal by the measurement signal generator 321.

The measurement signal generator 321 generates a measurement reference signal representing an electrical signal to measure the resonance properties (frequency characteristics) of the ear canal. The measurement reference signal is a predetermined electrical signal to measure the resonance properties of the ear canal.

The measurement reference signal generated by the measurement signal generator 321 is converted to an acoustic signal by the electroacoustic transducer 303. The measurement reference signal converted to an acoustic signal serves as a measurement acoustic signal. The term "measurement acoustic signal" as used herein refers to a signal composed of a plurality of sinusoidal waves including at least one of a unit pulse, a time stretch pulse, white noise, noise in a band including a measurement band, and a sinusoidal wave in the measurement band.

The measurement acoustic signal obtained by the electroacoustic transducer 303 is output from the sound output module 201. After that, the sound input module 202 receives a response acoustic signal (i.e., reflected sound) in response to the output measurement acoustic signal. The response acoustic signal received by the sound input module 202 is converted to an electrical signal by the acoustoelectric transducer 306. The electrical signal converted from the response acoustic signal serves as a response signal.

The response data obtaining module 324 obtains the response signal. The response signal refers to an electrical signal converted from a response acoustic signal reflected from the ear canal.

The characteristic specifying module 323 analyzes the frequency characteristics of the response signal to specify the resonance properties of the ear canal. The characteristic specifying module 323 of the embodiment specifies a resonant frequency with respect to each resonance peak by analyzing the response signal. Incidentally, the characteristic specifying module 323 may specify the resonant frequency using any methods including commonly known ones.

The characteristic specifying module 323 of the embodiment specifies resonance properties with respect to each frequency band. For example, the characteristic specifying module 323 specifies resonance properties with respect to a frequency band enclosing the first resonance peak. Similarly, the characteristic specifying module 323 specifies resonance properties with respect to a frequency band enclosing the second resonance peak. The characteristic specifying module 323 specifies the gain of each resonance peak, a resonant frequency, and the like as the resonance properties.

The parameter specifying module 322 specifies parameters set for an acoustic model with respect to each frequency band based on the resonance properties (frequency characteristics) specified by the characteristic specifying module 323 with respect to each frequency band. The parameter specifying module 322 of the embodiment specifies parameters set for an acoustic model created based on the first resonance peak and those set for an acoustic model created based on the second resonance peak. The acoustic model created based on each resonance peak will hereinafter referred to as a partial acoustic model.

As a parameter set for an acoustic model with respect to each frequency band, the parameter specifying module 322 of the embodiment specifies a propagation time for the acoustic model. More specifically, the parameter specifying module 322 specifies a propagation time set for a first partial acoustic model created based on the first resonance peak according to the resonance properties in the frequency band enclosing the first resonance peak. In addition, the parameter specifying module 322 specifies a propagation time set for a second partial acoustic model created based on the second resonance peak according to the resonance properties in the frequency band enclosing the second resonance peak. Incidentally, the parameter specifying module 322 may specify the propagation time using any methods including commonly known ones.

Further, the parameter specifying module 322 specifies reflectivity with respect to each acoustic model based on the width of each resonance peak. More specifically, the parameter specifying module 322 specifies reflectivity set for the first partial acoustic model based on the width of the first resonance peak. Besides, the parameter specifying module 322 specifies reflectivity set for the second partial acoustic model based on the width of the second resonance peak. Incidentally, the parameter specifying module 322 may specify the reflectivity using any methods including commonly known ones.

In this manner, the parameter specifying module 322 specifies parameters with respect to each partial acoustic model based on the resonance properties specified by the characteristic specifying module 323. With this, appropriate correction can be performed for each frequency band. Thus, even if n times of a resonant frequency of the fundamental oscillation does not match the resonant frequency of n-times oscillation, appropriate correction can be performed.

The sound source input module 301 receives a sound source signal that is the basis of an acoustic signal fed to the ear canal.

As described above, the sound source output mode processor 302 comprises the acoustic model adaptive filter 311. When the switch 308 switches the processing mode to the sound source output mode, the acoustic model adaptive filter 311, the electroacoustic transducer 303, and the sound output module 201 perform processing on a sound source signal received by the acoustic model adaptive filter 311 in the manner described below.

Figure 15:
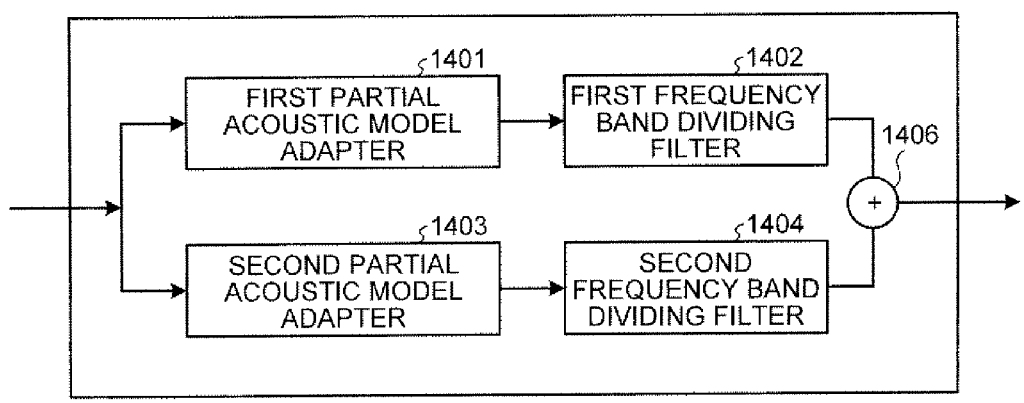
FIG. 15 is an exemplary block diagram of a configuration to create an acoustic model in an acoustic model adaptive filter in the embodiment.

Upon receipt of a sound source signal, the acoustic model adaptive filter 311 combines a plurality of partial acoustic models for which parameters have been set, and performs filtering on the sound source signal with the combination to thereby correct the sound source signal. FIG. 15 is a block diagram of the acoustic model adaptive filter 311 to which are applied acoustic models.

As illustrated in FIG. 15, the acoustic model adaptive filter 311 comprises a first partial acoustic model adapter 1401, a first frequency band dividing filter 1402, a second partial acoustic model adapter 1403, a second frequency band dividing filter 1404, and a combining module 1406.

The first partial acoustic model adapter 1401 creates the first partial acoustic model with the reverse characteristics of a resonance peak based on the first resonance peak according to the parameters specified by the parameter specifying module 322. Similarly, the second partial acoustic model adapter 1403 creates the second partial acoustic model with the reverse characteristics of a resonance peak based on the second resonance peak according to the parameters specified by the parameter specifying module 322.

The first frequency band dividing filter 1402 extracts a frequency component in the frequency band enclosing the first resonance peak from the first partial acoustic model created by the first partial acoustic model adapter 1401. In the embodiment, the first frequency band dividing filter 1402 may be, for example, a low-pass filter that extracts low frequency components.

The second frequency band dividing filter 1404 extracts a frequency component in the frequency band enclosing the second resonance peak and the following resonance peaks from the second partial acoustic model created by the second partial acoustic model adapter 1403. In the embodiment, the second frequency band dividing filter 1404 may be, for example, a high-pass filter that extracts high frequency components.

Incidentally, the frequency that separates the frequency band enclosing the first resonance peak and the frequency band enclosing the second resonance peak and the following resonance peaks may be set from those between a first resonant frequency of the fundamental oscillation and a second resonant frequency of the double oscillation.

The combining module 1406 combines the frequency component in the frequency band enclosing the first resonance peak from the first frequency band dividing filter 1402 and the frequency component in the frequency band enclosing the second resonance peak and the following resonance peaks from the second frequency band dividing filter 1404. In other words, the combining module 1406 combines the frequency component in the frequency band enclosing the first resonance peak extracted from the first partial acoustic model and the frequency component in the frequency band enclosing the second resonance peak extracted from the second partial acoustic model, thereby creating an acoustic model.

Figure 16:
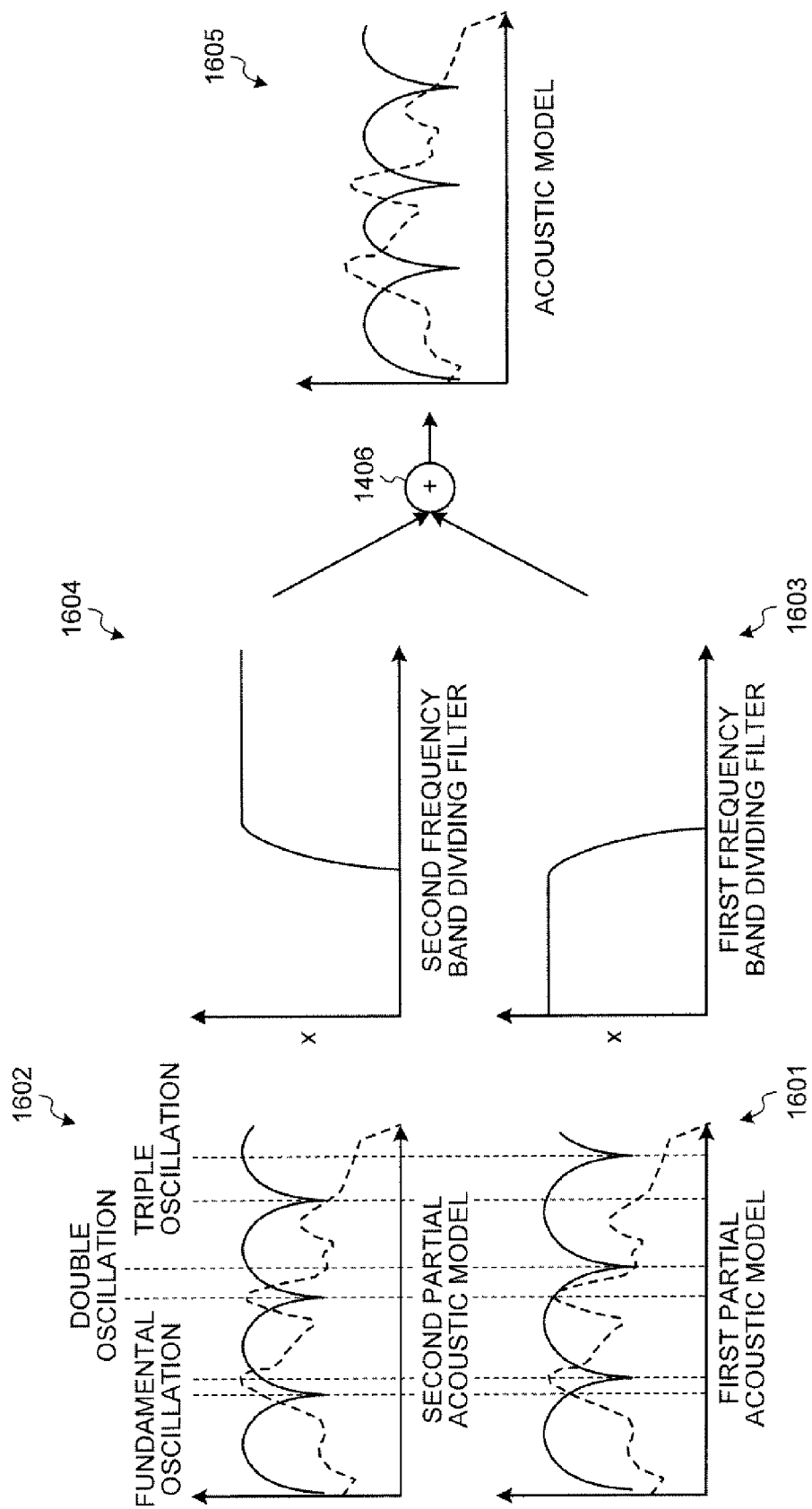
FIGS. 16 is an exemplary conceptual diagram of the acoustic model created in the acoustic model adaptive filter in the embodiment.

FIG. 16 is a conceptual diagram of acoustic models created in the acoustic model adaptive filter 311. In FIG. 16, a first partial acoustic model 1601 is created by the first partial acoustic model adapter 1401. Meanwhile, a second partial acoustic model 1602 is created by the second partial acoustic model adapter 1403.

From the first partial acoustic model 1601, a first frequency band dividing filter 1603 extracts only frequency component in the low frequency band enclosing the first resonance peak. On the other hand, from the second partial acoustic model 1602, a second frequency band dividing filter 1604 extracts only frequency component in the high frequency band enclosing the second resonance peak. The combining module 1406 combines partial acoustic models of the respective frequency components extracted by the first frequency band dividing filter 1603 and the second frequency band dividing filter 1604 to create an acoustic model 1605. With the acoustic model 1605 thus created, the acoustic model adaptive filter 311 performs filtering on a sound source signal.

More specifically, in the first partial acoustic model adapter 1401, a first comb filter is created based on the first partial acoustic model 1601. The delay elements ($z_1$ to $z_n$) and amplifying elements ($b_1$ to $b_n$) of the comb filters are each set to a value based on the specified propagation time and reflectivity. On the other hand, in the second partial acoustic model adapter 1403, a second comb filter is created based on the second partial acoustic model 1602.

After being corrected by the first comb filter, a sound source signal input to the first partial acoustic model adapter 1401 is input to the first frequency band dividing filter 1402. The first frequency band dividing filter 1402 extracts only a sound source signal in the frequency band enclosing the first resonance peak.

On the other hand, after being filtered by the second comb filter, a sound source signal input to the second partial acoustic model adapter 1403 is input to the second frequency band dividing filter 1404. The second frequency band dividing filter 1404 extracts only a sound source signal in the frequency band enclosing the second resonance peak and the following resonance peaks.

The combining module 1406 combines the sound source signal in the frequency band enclosing the first resonance peak and that in the frequency band enclosing the second resonance peak and the following resonance peaks. Thus, a sound source signal is generated that has been corrected to suppress the resonance at each of the resonance peaks.

Figure 17:
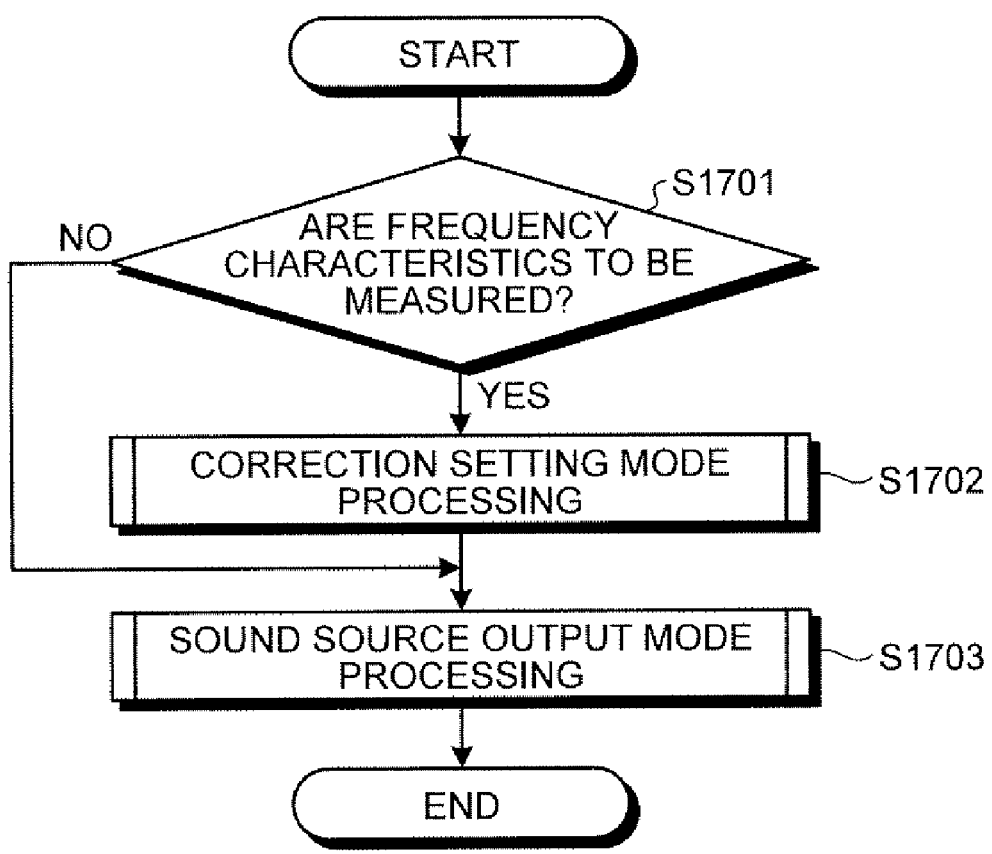
FIG. 17 is an exemplary flowchart of the operation of the acoustic characteristic correction device in the embodiment.

In the following, a description will be given of the operation of the acoustic characteristic correction device 150 according to the embodiment. FIG. 17 is a flowchart of the operation of the acoustic characteristic correction device 150.

First, the switch 308 determines to measure the frequency characteristics or acoustic properties (S1701). When the switch 308 determines to measure the acoustic properties (Yes at S1701), the correction setting mode processor 307 performs processing in the correction setting mode, i.e., correction setting mode processing (S1702).

On the other hand, when the switch 308 determines not to measure the frequency characteristics (No at S1701), or after the completion of the processing at S1702, the sound source output mode processor 302 performs processing in the sound source output mode, i.e., sound source output mode processing (S1703). In the manner as described above, the processing is performed in each mode.

Figure 18:
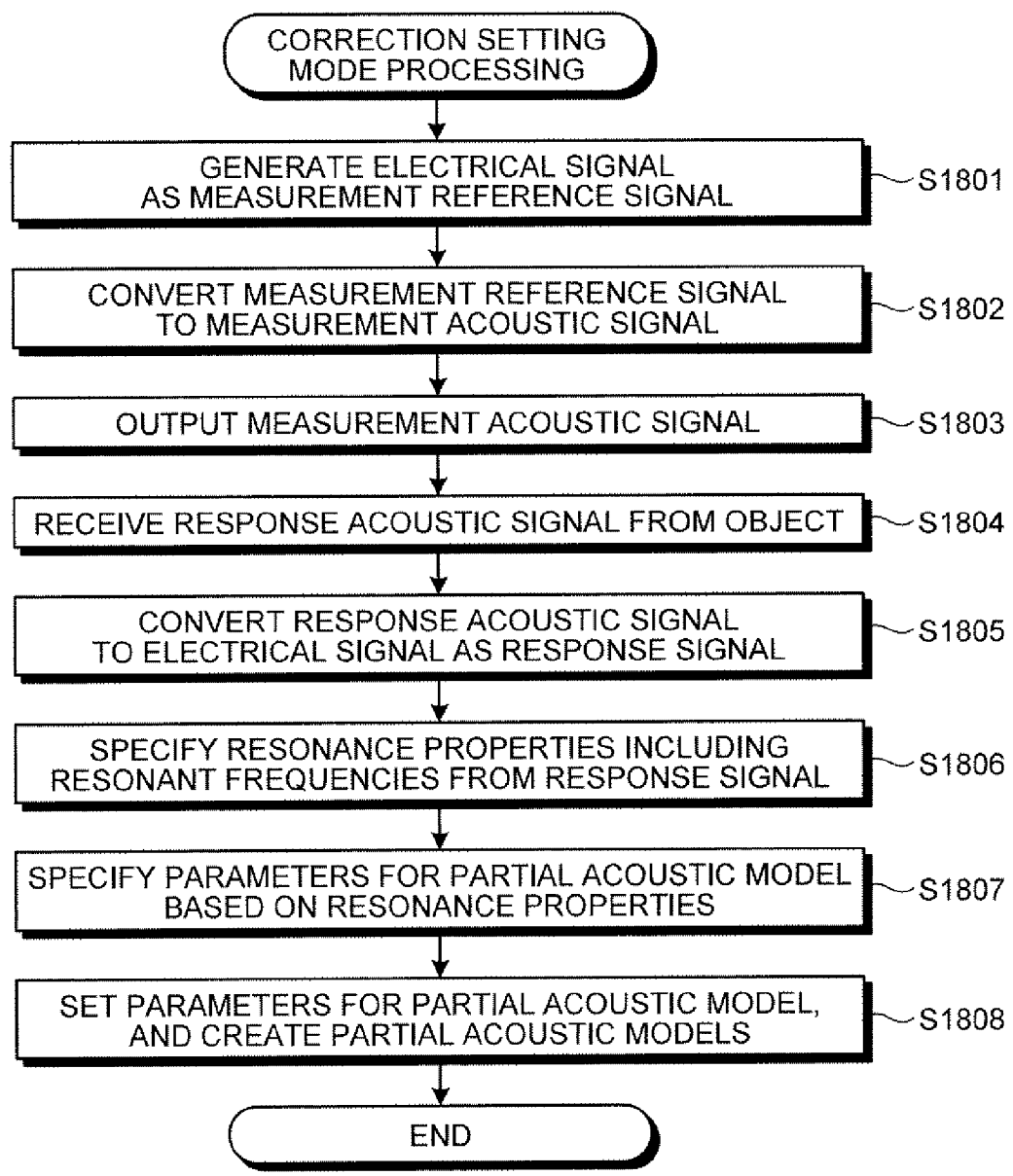
FIG. 18 is an exemplary flowchart of the operation of the acoustic characteristic correction device in correction setting mode in the embodiment.

A description will now be given of the operation of the acoustic characteristic correction device 150 in the correction setting mode. FIG. 18 is a flowchart of the correction setting mode processing performed by the acoustic characteristic correction device 150.

First, the measurement signal generator 321 generates a measurement reference signal representing an electrical signal to measure the resonance properties (frequency characteristics) of the ear canal (S1801). Next, the electroacoustic transducer 303 converts the measurement reference signal to a measurement acoustic signal (S1802). Then, the sound output module 201 outputs the measurement acoustic signal to the ear canal (S1803).

After that, the sound input module 202 receives a response acoustic signal reflected from the ear canal (S1804). The acoustoelectric transducer 306 converts the response acoustic signal to an electrical signal as a response signal (S1805).

The response data obtaining module 324 obtains the response signal. Thereafter, from the response signal, the characteristic specifying module 323 specifies the resonance properties including resonant frequencies at resonance peaks such as the first resonance peak and the second resonance peak (S1806). Subsequently, based on the resonance properties specified by the characteristic specifying module 323, the parameter specifying module 322 specifies parameters for a partial acoustic model of each acoustic model (S1807). The parameter specifying module 322 then sets the parameters for the partial acoustic model, and thereby a plurality of partial acoustic models are created in the acoustic model adaptive filter 311 (S1808). In the embodiment, acoustic models with the reverse characteristics of the respective resonance peaks are created.

In the manner as described above, the partial acoustic models are created to perform appropriate correction for the ear canal of the user. Since the acoustic model adaptive filter 311 is configured to combine frequency components in the frequency bands from the partial acoustic models, an acoustic model is created that corresponds to a combination of the frequency components in the partial acoustic models.

Figure 19:
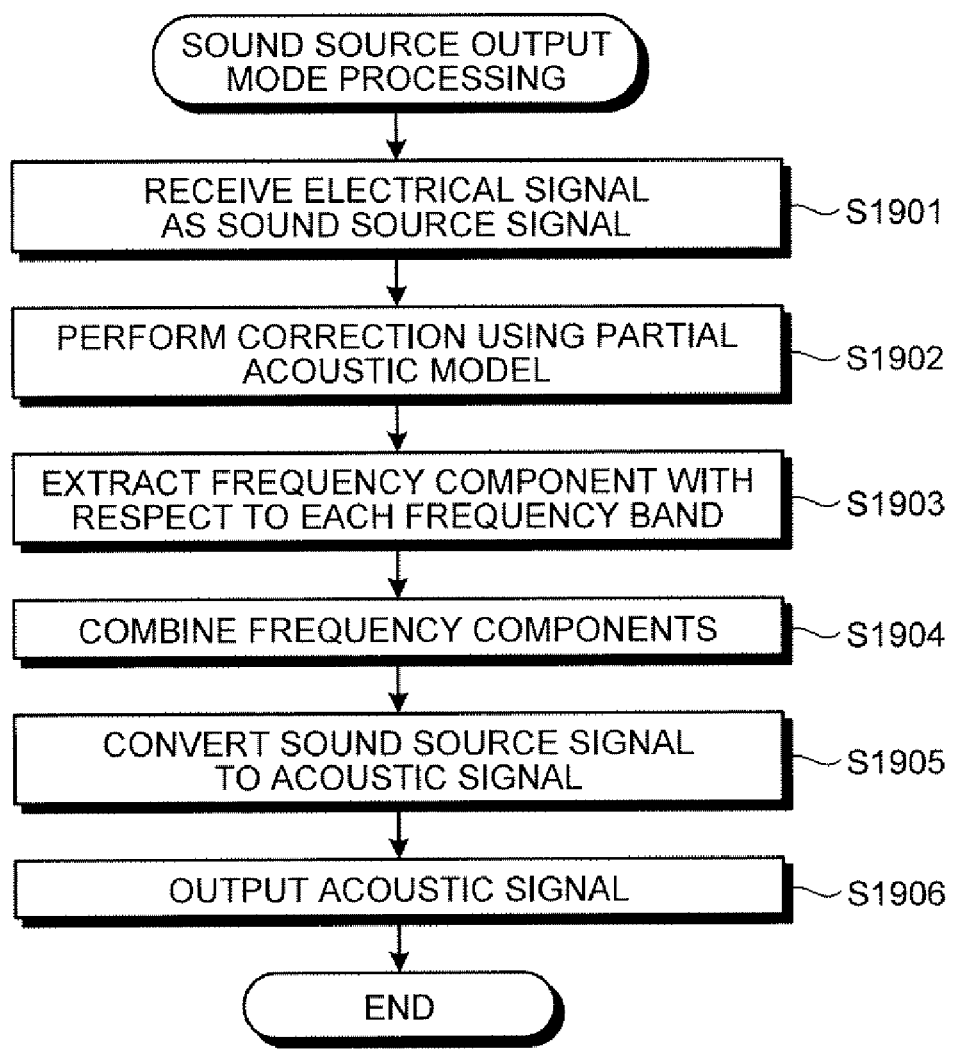
FIG. 19 is an exemplary flowchart of the operation of the acoustic characteristic correction device to output an acoustic signal in the embodiment.

A description will then be given of the operation of the acoustic characteristic correction device 150 in the sound source output mode to output an acoustic signal. FIG. 19 is a flowchart of the sound source output mode processing performed by the acoustic characteristic correction device 150.

First, the sound source input module 301 receives an electrical signal as a sound source signal from the mobile telephone 110 (S1901).

Next, the first partial acoustic model adapter 1401 and the second partial acoustic model adapter 1403 each perform correction on the sound source signal with a filter using the created partial acoustic model (S1902). Then, the first frequency band dividing filter 1402 and the second frequency band dividing filter 1404 each extract a frequency component in each frequency band with respect to the sound source signal corrected with the filter using the acoustic model (S1903).

Then, the combining module 1406 combines sound source signals of the extracted frequency components in the frequency bands (S1904). Thus, a sound source signal is created on which appropriate correction has been performed with respect to each frequency band.

After that, the electroacoustic transducer 303 converts the sound source signal to an acoustic signal (S1905). Subsequently, the sound output module 201 outputs the acoustic signal to the ear canal (S1906).

In the manner as described above, even if the ear canal is of a complicated shape including a narrow zone, and the resonant frequency does not always occur as an integer multiple of the fundamental oscillation frequency differently from the case of the uniform resonance tube, it is possible to output an acoustic signal on which correction has been performed according to the ear canal.

Although the embodiment is described above by taking the earphone 120 as an example, it is not so limited, and can be applied to, for example, a headphone.

As described above, according to the embodiment, the acoustic characteristic correction device 150 enables correction according to the characteristics of the ear or ears of the individual. Moreover, the acoustic characteristic correction device 150 enables correction according to the difference between left and right ears and the condition that the earphone is placed.

Furthermore, the acoustic characteristic correction device 150 performs correction to suppress the resonance peak, thereby enabling correction with low degradation in sound quality. Besides, since the acoustic characteristic correction device 150 uses not the identification results of resonance properties or the like but the resonance properties, tuning can be achieved easily with fewer parameters. In addition, the operation can be reduced.

Further, the acoustic characteristic correction device 150 combines partial acoustic models created based on respective resonance peaks. Thus, compared with the case of identifying the resonance properties of the user, the processing load and cost can be reduced.

Still further, the acoustic characteristic correction device 150 enables flexible and easy correction with respect to the resonance properties of the object to be measured having acoustic properties that are not flat on the frequency scales, thereby improving the acoustic properties. Still further, compared with the case of identifying the resonance properties of the user, because no factor is included except for the characteristics of the ear, it is possible to improve the accuracy of the correction and thereby to improve the sound quality.

In the embodiment described above, a filter is created by using an acoustic model to eliminate the resonance peak. However, the acoustic model is not so limited, and may be created so that it represents the resonance peak. As a modification of the embodiment, an example will be described in which an acoustic model is created that represents the resonance peak. Constituent elements corresponding to those of the above embodiment are designated by the same reference numerals, and their description will not be repeated.

Figure 20:
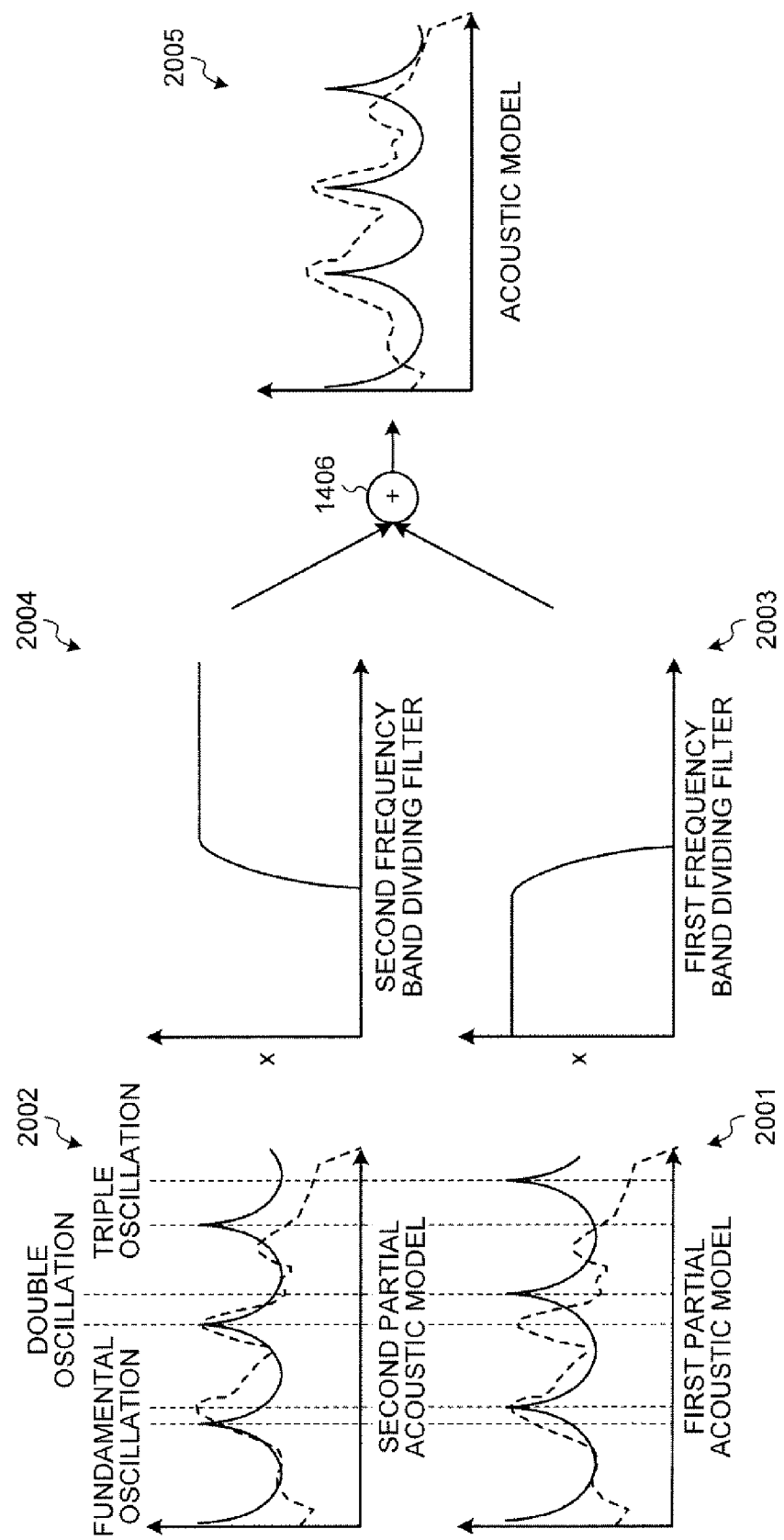
FIG. 20 is an exemplary conceptual diagram of an acoustic model created in an acoustic model adaptive filter according to a modification of the embodiment.

FIG. 20 is a conceptual diagram of an acoustic model created in the acoustic model adaptive filter 311 according to the modification of the embodiment. In FIG. 20, a first partial acoustic model 2001 is created by the first partial acoustic model adapter 1401. Meanwhile, a second partial acoustic model 2002 is created by the second partial acoustic model adapter 1403.

From the first partial acoustic model 2001, a first frequency band dividing filter 2003 extracts only frequency component in the low frequency band enclosing the first resonance peak. On the other hand, from the second partial acoustic model 2002, a second frequency band dividing filter 2004 extracts only frequency component in the high frequency band enclosing the second resonance peak. The combining module 1406 combines partial acoustic models of the respective frequency components extracted by the first frequency band dividing filter 2003 and the second frequency band dividing filter 2004 to create an acoustic model 2005. With the acoustic model 2005 thus created, the acoustic model adaptive filter 311 performs filtering on a sound source signal.

The first partial acoustic model created by the first partial acoustic model adapter 1401 is input to the first frequency band dividing filter 1402. The first frequency band dividing filter 1402 extracts only the acoustic model of the frequency band enclosing the first resonance peak. On the other hand, the second partial acoustic model created by the second partial acoustic model adapter 1403 is input to the second frequency band dividing filter 1404. The second frequency band dividing filter 1404 extracts only the acoustic model of the frequency band enclosing the second resonance peak and the following resonance peaks.

The combining module 1406 combines the first partial acoustic model of the frequency band enclosing the first resonance peak and the second partial acoustic model of the frequency band enclosing the second resonance peak and the following resonance peaks. Thus, it is possible to create an acoustic model corrected to suppress the resonance at each of the resonance peaks.

As described above, an acoustic model can be created that appropriately represents each of the resonance peaks. The acoustic model can be applied to various purposes such as removal of the resonance properties.

In the embodiment and the modification thereof described above, the acoustic model created in the acoustic characteristic correction device 150 is described by way of example as representing the ear canal in which an earphone is placed. With this system, the acoustic properties when the earphone is worn can be intentionally added to the acoustic properties when the earphone is not worn. Alternatively, by creating an acoustic model with the acoustic properties when the earphone is not worn, the acoustic properties when the earphone is worn can be removed from the acoustic model.

The acoustic characteristic correction device 150 of the embodiment and the modification thereof enables flexible and easy correction with respect to the resonance properties of the object to be measured having acoustic properties that are not flat on the frequency scales. Further, the acoustic characteristic correction device 150 can be applied to an object having complicated characteristics or in disadvantageous conditions in terms of hardware resources. That is, the applicability is improved.

Assuming that the ear canal in which an earphone is placed is a uniform resonance tube having numerous resonant frequencies blocked by a wall (eardrum) and the earphone, it may be difficult to eliminate a resonant frequency that adversely affects the sense of hearing. According to the modification of the embodiment, an acoustic model can be created that appropriately represents each of the resonance peaks. Thus, by creating a filter based on the acoustic model, it is possible to effectively eliminate a resonant frequency that adversely affects the sense of hearing.

With the acoustic model and the reverse filter model of the modification of the embodiment, the same effect as in the embodiment can be achieved.

Figure 21:
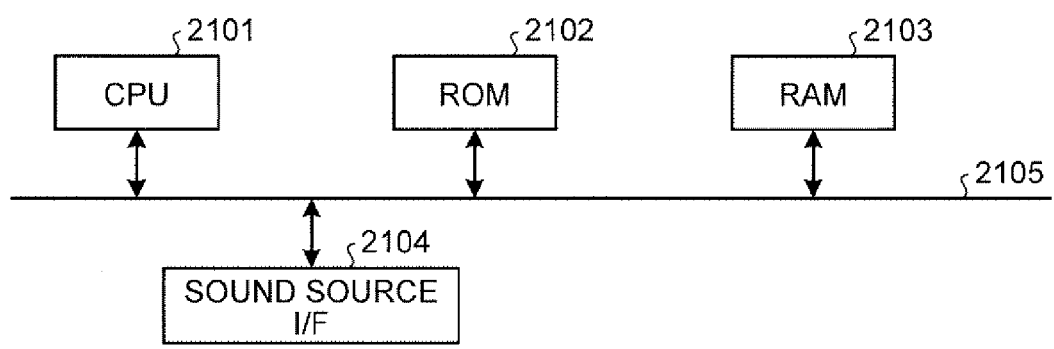
FIG. 21 is an exemplary block diagram of a hardware configuration of the acoustic characteristic correction device in the embodiment.

FIG. 21 is a block diagram of a hardware configuration of the acoustic characteristic correction device 150. As illustrated in FIG. 21, the acoustic characteristic correction device 150 comprises a central processing unit (CPU) 2101, a read only memory (ROM) 2102, a random access memory (RAM) 2103, and a sound source interface (I/F) 2104, which are interconnected by a bus 2105. The acoustic characteristic correction device 150 has a hardware configuration using a common computer.

That is, a computer program (hereinafter "acoustic characteristic correction program") may be executed on the computer to realize the same function as the acoustic characteristic correction device 150. The acoustic characteristic correction program may be provided as being stored in advance in the ROM 2102 or the like.

The acoustic characteristic correction program may also be provided as being stored in a computer-readable storage medium, such as a compact disk read-only memory (CD-ROM), a flexible disk (FD), a compact disc-recordable (CD-R), or a digital versatile disc (DVD), as a file in an installable or executable format.

Further, the acoustic characteristic correction program may also be stored in a computer connected via a network such as the Internet so that it can be downloaded therefrom. Still further, the acoustic characteristic correction program may also be provided or distributed via a network such as the Internet.

The acoustic characteristic correction program includes modules that implement the respective constituent elements described above. As hardware, the CPU 2101 loads the acoustic characteristic correction program from the ROM 2102 or the like into the RAM 2103 and executes it. Thus, the respective constituent elements are implemented on the RAM 2103.

The various modules of the systems described herein can be implemented as software applications, hardware and/or software modules, or components on one or more computers, such as servers. While the various modules are illustrated separately, they may share some or all of the same underlying logic or code.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A sound processor comprising:
    a creating module configured to create first and second resonance tube models based on a frequency characteristic that represents an acoustic property of an object to be measured, the first resonance tube model being modeled based on resonance properties of a first resonance peak with respect to a frequency band enclosing a first resonance frequency at the first resonance peak represented as the frequency characteristic, the second resonance tube model being modeled based on resonance properties of a second resonance peak with respect to a frequency band enclosing a high order resonance frequency which is not an integer multiple of the first resonance frequency at the second resonance peak represented as the frequency characteristic;
    a filter configured to extract frequency component in the frequency band enclosing the first resonance frequency from the first resonance tube model to create a first partial acoustic model, and extract frequency component in the frequency band enclosing the second resonance frequency from the second resonance tube model to create a second partial acoustic model; and
    a combining module configured to combine the first partial acoustic model and the second partial acoustic model to create an entire acoustic model.

2. The sound processor of claim 1, further comprising a corrector configured to correct an acoustic property of an acoustic signal to be output to the object to be measured using the second acoustic model.

3. The sound processor of claim 1, wherein the creating module is configured to create the partial acoustic models each representing a reverse characteristic of a resonance peak with respect to each of the frequency bands.

4. The sound processor of claim 1, wherein the creating module is configured to create the partial acoustic models each representing a characteristic of a resonance peak with respect to each of the frequency bands.

5. A sound reproducer comprising:
    a creating module configured to create first and second resonance tube models based on a frequency characteristic that represents an acoustic property of an object to be measured, the first resonance tube model being modeled based on resonance properties of a first resonance peak with respect to a frequency band enclosing a first resonance frequency at the first resonance peak represented as the frequency characteristic, the second resonance tube model being modeled based on resonance properties of a second resonance peak with respect to a frequency band enclosing a high order resonance frequency which is not an integer multiple of the first resonance frequency at the second resonance peak represented as the frequency characteristic;
    a filter configured to extract frequency component in the frequency band enclosing the first resonance frequency from the first resonance tube model to create a first partial acoustic model, and extract frequency component in the frequency band enclosing the second resonance frequency from the second resonance tube model to create a second partial acoustic model;
    a combining module configured to combine the first partial acoustic model and the second partial acoustic model to create an entire acoustic model;
    a signal generator configured to generate an acoustic signal to be output to the object to be measured; and
    a corrector configured to correct an acoustic property of the acoustic signal generated by the signal generator using the second acoustic model.

6. A sound processing method applied to a sound processor, the sound processing method comprising:
    creating first and second resonance tube models based on a frequency characteristic that represents an acoustic property of an object to be measured, the first resonance tube model being modeled based on resonance properties of a first resonance peak with respect to a frequency band enclosing a first resonance frequency at the first resonance peak represented as the frequency characteristic, the second resonance tube model being modeled based on resonance properties of a second resonance peak with respect to a frequency band enclosing a high order resonance frequency which is not an integer multiple of the first resonance frequency at the second resonance peak represented as the frequency characteristic;
    extracting frequency component in the frequency band enclosing the first resonance frequency from the first resonance tube model to create a first partial acoustic model, and extract frequency component in the frequency band enclosing the second resonance frequency from the second resonance tube model to create a second partial acoustic model; and combining the first partial acoustic model and the second partial acoustic model to create an entire acoustic model.

7. The sound processing method of claim 6, wherein the creating is performed by a creating module, the extracting is performed by a filter, and the combining is performed by a combining module.

8. The sound processing method of claim 6, further comprising correcting an acoustic property of an acoustic signal to be output to the object to be measured using the second acoustic model.

9. The sound processing method of claim 8, wherein the correcting is performed by a corrector.

* * * * *